(12) United States Patent
Toivonen et al.

(10) Patent No.: US 11,223,322 B2
(45) Date of Patent: Jan. 11, 2022

(54) UP-CONVERTER AND MOBILE TERMINAL HAVING THE SAME

(71) Applicant: LG ELECTRONICS INC., Seoul (KR)

(72) Inventors: Ossi Toivonen, Turku (FI); Sami Vilhonen, Turku (FI)

(73) Assignee: LG ELECTRONICS INC., Seoul (KR)

( * ) Notice: Subject to any disclaimer, the term of this patent is extended or adjusted under 35 U.S.C. 154(b) by 648 days.

(21) Appl. No.: 15/999,316

(22) PCT Filed: Apr. 5, 2018

(86) PCT No.: PCT/KR2018/004031
§ 371 (c)(1),
(2) Date: Aug. 17, 2018

(87) PCT Pub. No.: WO2019/164051
PCT Pub. Date: Aug. 29, 2019

(65) Prior Publication Data
US 2021/0218369 A1 Jul. 15, 2021

Related U.S. Application Data

(60) Provisional application No. 62/633,610, filed on Feb. 22, 2018.

(51) Int. Cl.
*H03D 7/14* (2006.01)
*H03D 7/16* (2006.01)
*H04B 1/16* (2006.01)

(52) U.S. Cl.
CPC ......... *H03D 7/1441* (2013.01); *H03D 7/1458* (2013.01); *H03D 7/1466* (2013.01);
(Continued)

(58) Field of Classification Search
CPC .. H03D 7/1441; H03D 7/1458; H03D 7/1491; H03D 2200/0019; H04B 1/04; H04B 2001/0491
See application file for complete search history.

(56) References Cited

U.S. PATENT DOCUMENTS 7,336,931 B2 * 2/2008 Craninckx ............. H03C 3/406
455/553.1
8,378,733 B2 * 2/2013 Zeller ................... H03D 7/165
327/359
(Continued)

FOREIGN PATENT DOCUMENTS

EP 1949532 5/2015

OTHER PUBLICATIONS

PCT International Application No. PCT/KR2018/004031, Notification of Transmittal of the International Search Report and the Written Opinion of the International Searching Authority, or Declaration dated Nov. 13, 2018, 10 pages.

*Primary Examiner* — Ryan Johnson
(74) *Attorney, Agent, or Firm* — Lee, Hong, Degerman, Kang & Waimey

(57) ABSTRACT

A mobile terminal including an up-converter converting a baseband (BB) signal into a radio frequency (RF) signal and a controller controlling a voltage applied to the up-converter is provided. The up-converter includes a first transistor and a second transistor each having a gate to which a baseband voltage is applied, a third transistor having a drain connected in parallel to a drain of the first transistor, and a fourth transistor having a drain connected in parallel to a drain of the second transistor, and the up-converter and the mobile terminal with improved phase linearity characteristics may be provided.

12 Claims, 10 Drawing Sheets

(52) U.S. Cl.
CPC ............. *H03D 7/1491* (2013.01); *H03D 7/16* (2013.01); *H04B 1/16* (2013.01)

(56) References Cited

U.S. PATENT DOCUMENTS

| | | | |
|---|---|---|---|
| 8,897,344 B2* | 11/2014 | Maguire | H04W 76/10 375/219 |
| 9,935,663 B1* | 4/2018 | Rofougaran | H04B 1/0483 |
| 9,960,883 B1* | 5/2018 | Chakraborty | H03D 7/1458 |
| 2014/0120846 A1 | 5/2014 | Kuo et al. | |
| 2015/0038095 A1 | 2/2015 | Uehara et al. | |
| 2015/0188741 A1 | 7/2015 | Chen et al. | |
| 2017/0111011 A1 | 4/2017 | Lin et al. | |

\* cited by examiner

[Fig. 12]
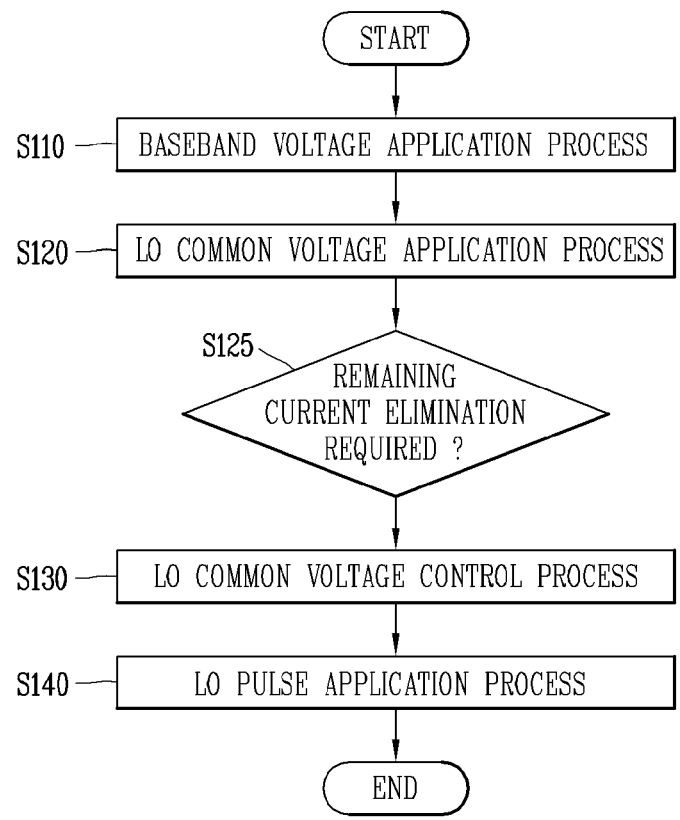

UP-CONVERTER AND MOBILE TERMINAL HAVING THE SAME

CROSS-REFERENCE TO RELATED APPLICATIONS

This application is the National Stage filing under 35 U.S.C. 371 of International Application No. PCT/KR2018/004031, filed on Apr. 5, 2018, which claims the benefit of U.S. Provisional Application No. 62/633,610, filed on Feb. 22, 2018, the contents of which are all hereby incorporated by reference herein in their entirety.

TECHNICAL FIELD

The present disclosure relates to a mobile terminal having a radio frequency (RF) up-converter for generating an RF signal, and more particularly, to a mobile terminal having an up-converter with improved phase linearity characteristics.

BACKGROUND ART

Terminals may be divided into mobile/portable terminals and stationary terminals according to mobility. Also, the mobile terminals may be classified into handheld types and vehicle mount types according to whether or not a user can directly carry.

Mobile terminals have become increasingly more functional. Examples of such functions include data and voice communications, capturing images and video via a camera, recording audio, playing music files via a speaker system, and displaying images and video on a display unit. Some mobile terminals include additional functionality which supports electronic game playing, while other terminals are configured as multimedia players. Specifically, in recent time, mobile terminals can receive broadcast and multicast signals to allow viewing of video or television programs.

As it becomes multifunctional, a mobile terminal can be allowed to capture still images or moving images, play music or video files, play games, receive broadcast and the like, so as to be implemented as an integrated multimedia player.

Efforts are ongoing to support and increase the functionality of mobile terminals. Such efforts include software and hardware improvements, as well as changes and improvements in the structural components.

In addition to these attempts, wireless communication systems using an LTE communication technology have been recently commercialized to provide various services. Also, in the future, it is expected that a wireless communication system using 5G communication technology will be commercialized to provide various services. In this regard, a distortion signal is generated in a (frequency) up-converter (or down-converter) for converting a baseband signal or an intermediate frequency (IF) signal to an RF frequency signal due to phase noise, or the like, to degrade performance of a communication system. In this regard, a degradation of characteristics such as phase linearity, or the like, in the up-converter and down-converter described above results from remaining charges in a transistor in the up-converter and the down-converter.

Particularly, in a power amplifier operating in a higher frequency band such as a 5G communication system, characteristics of an RF system including an up-converter and a down-converter may significantly affect performance of the entire communication system. Therefore, the up-converter and down-converter operating in higher frequency bands, such as 5G communication systems, have a problem that performance degradation of the communication system due to phase noise is greater.

DISCLOSURE OF THE INVENTION

Therefore, an aspect of the detailed description is to solve the aforementioned problem and other problems. Another aspect of the detailed description is to provide an up-converter having improved phase linearity characteristics and a mobile terminal having the up-converter.

Another aspect of the detailed description is to provide an up-converter capable of removing remaining charges before a pulse signal of a local oscillator (LO) is applied, and a mobile terminal having the up-converter.

To achieve these and other advantages and in accordance with the purpose of this specification, as embodied and broadly described herein, a mobile terminal Including an up-converter converting a baseband (BB) signal into a radio frequency (RF) signal and a controller controlling a voltage applied to the up-converter is provided. The up-converter includes a first transistor and a second transistor each having a gate to which a baseband voltage is applied, a third transistor having a drain connected in parallel to a drain of the first transistor, and a fourth transistor having a drain connected in parallel to a drain of the second transistor, and the up-converter and the mobile terminal with improved phase linearity characteristics may be provided.

In an embodiment, the mobile terminal may further include a fifth transistor having a source connected in series to the drain of the first transistor and outputting a first RF signal through a drain and a sixth transistor having a source connected in series to the drain of the second transistor and outputting a second RF signal through a drain.

In an embodiment, the mobile terminal may further include a seventh transistor having a source connected in parallel to the drain of the third transistor and a drain connected in parallel to the drain of the sixth transistor and an eighth transistor having a source connected in parallel to the drain of the fourth transistor and a drain connected in parallel to the drain of the fifth transistor.

In an embodiment, the controller may control the up-converter to apply VBB+ and VBB− voltages to the gate of the first transistor and the gate of the second transistor, respectively, a V2LO voltage to the gates of the third transistor and the fourth transistor, a VLO+ voltage to the gates of the fifth transistor and the sixth transistor, and a VLO− voltage to the gates of the seventh transistor and the eighth transistor.

In an embodiment, the VLO+ voltage may be applied in the form of an LO pulse signal, and before the LO pulse signal is generated and applied to the gates of the fifth transistor and the sixth transistor, the V2LO voltage may be pulled low to below a threshold value to perform charge removal during an OFF cycle of the LO pulse signal.

In an embodiment, the mobile terminal may further include a buffer circuit providing the V2LO voltage to the gates of the third and fourth transistors. Also, the buffer circuit may include a logical circuit performing NORing on logical inputs LO and Lox and first to fourth transition transistors connected in parallel to outputs of the logical circuit. Here, an output of the buffer circuit corresponding to the V2LO voltage may be provided to the up-converter, and the first to fourth transition transistors may enable fast transition of the V2LO voltage from a high state to a low state.

In an embodiment, the first RF signal may be an in-phase (I) channel signal, the second RF signal may be a quadrature-phase (Q) channel signal. Here, the first RF signal and the second RF signal may be applied to a first power amplifier and a second power amplifier, respectively, and a signal amplified and combined through the first power amplifier and the second power amplifier may be transmitted through an antenna.

In an embodiment, the controller may control ON/OFF of an electrical connection between the third transistor and the fourth transistor and a first transistor and a second transistor of each of first to nth up-converters.

In an embodiment, the controller may select an up-converter required to quickly transition from a high state of the V2LO voltage to a low state during an OFF cycle of the LO pulse signal, among the first up-converter to the nth up-converter and control an electrical connection of the third transistor and the fourth transistor and the first transistor and the second transistor of the selected up-converter, to an ON state. In this regard, the third transistor and the fourth transistor may be disposed in each of the first up converter to the nth up converter. Alternatively, the third transistor and the fourth transistor may be disposed outside the first up converter to the nth up converter.

To achieve these and other advantages and in accordance with the purpose of this specification, as embodied and broadly described herein, an up-converter converting a baseband signal into a radio frequency (RF) signal is provided. The up-converter may include a first transistor and a second transistor each having a gate to which a baseband voltage is applied, a third transistor having a drain connected in parallel to a drain of the first transistor, and a fourth transistor having a drain connected in parallel to a drain of the second transistor. Here, the drain of the first transistor and the drain of the second transistor output a first RF signal and a second RF signal through a transistor connected in series, respectively.

In an embodiment, the mobile terminal may further include a fifth transistor having a source connected in series to the drain of the first transistor and outputting a first RF signal through a drain and a sixth transistor having a source connected in series to the drain of the second transistor and outputting a second RF signal through a drain.

In an embodiment, the mobile terminal may further include a seventh transistor having a source connected in parallel to the drain of the third transistor and a drain connected in parallel to the drain of the sixth transistor and an eighth transistor having a source connected in parallel to the drain of the fourth transistor and a drain connected in parallel to the drain of the fifth transistor.

In an embodiment, VBB+ and VBB− voltages may be applied to the gate of the first transistor and the gate of the second transistor, respectively, a V2LO voltage may be applied to the gates of the third transistor and the fourth transistor, a VLO+ voltage may be applied to the gates of the fifth transistor and the sixth transistor, and a VLO− voltage may be applied to the gates of the seventh transistor and the eighth transistor.

In an embodiment, the VLO+ voltage may be applied in the form of an LO pulse signal, and before the LO pulse signal is generated and applied to the gates of the fifth transistor and the sixth transistor, the V2LO voltage may be pulled low to below a threshold value to perform charge removal during an OFF cycle of the LO pulse signal.

Effects of the mobile terminal and the up-converter according to the present disclosure are as follows.

According to at least one of the embodiments of the present disclosure, the up-converter and the mobile terminal with improved phase linearity characteristics may be provided.

In addition, according to at least one of the embodiments of the present disclosure, the RF front end and the mobile terminal with improved frequency drift performance by removing remaining charges before a pulse signal of a local oscillator (LO) is applied may be provided.

Furthermore, according to at least one of the embodiments of the present disclosure, the mobile terminal including the RF front end with improved phase linearity characteristics may be provided even in a structure including a plurality of up-converters.

Further scope of applicability of the present application will become more apparent from the detailed description given hereinafter. However, it should be understood that the detailed description and specific examples, while indicating preferred embodiments of the disclosure, are given by way of illustration only, since various changes and modifications within the spirit and scope of the disclosure will become apparent to those skilled in the art from the detailed description.

BRIEF DESCRIPTION OF THE DRAWINGS

The accompanying drawings, which are included to provide a further understanding of the disclosure and are incorporated in and constitute a part of this specification, illustrate exemplary embodiments and together with the description serve to explain the principles of the disclosure.

In the drawings:

FIG. 12 is a flowchart of a control method for improving phase linearity characteristics of an up-converter according to the present disclosure.

MODES FOR CARRYING OUT THE PREFERRED EMBODIMENTS

Figure 1A:
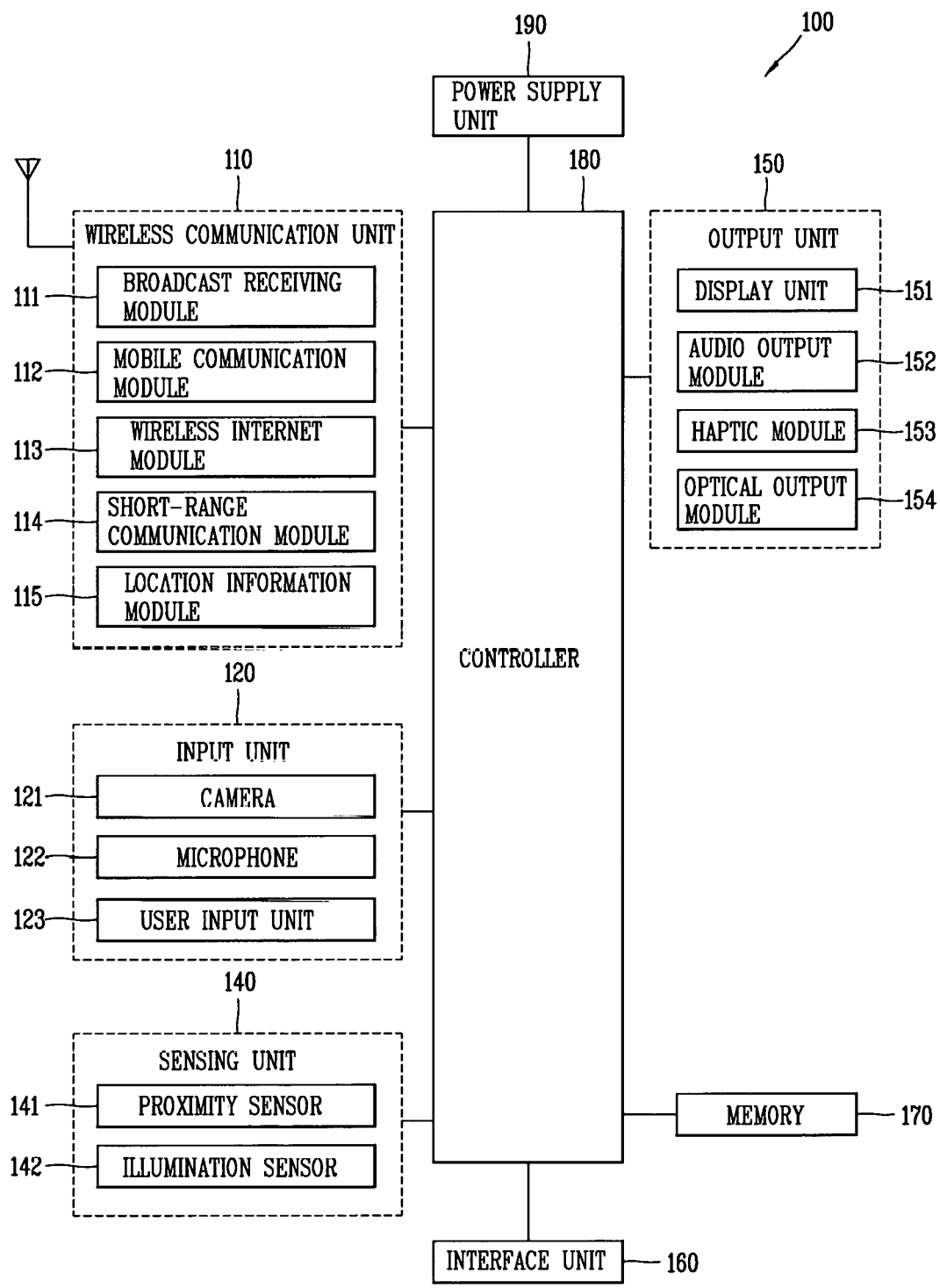
FIG. 1A is a block diagram illustrating a mobile terminal according to the present disclosure.

Description will now be given in detail of exemplary embodiments, with reference to the accompanying drawings. For the sake of brief description with reference to the drawings, the same or equivalent components may be provided with the same or similar reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In describing the present disclosure, if a detailed explanation for a related known function or construction is considered to unnecessarily divert the gist of the present disclosure, such explanation has been omitted but would be understood by those skilled in the art. The accompanying drawings are used to help easily understand the technical idea of the present disclosure and it should be understood that the idea of the present disclosure is not limited by the accompanying drawings. The idea of the present disclosure should be construed to extend to any alterations, equivalents and substitutes besides the accompanying drawings.

It will be understood that although the terms first, second, etc. may be used herein to describe various elements, these elements should not be limited by these terms. These terms are generally only used to distinguish one element from another.

It will be understood that when an element is referred to as being "connected with" another element, the element can be connected with the another element or intervening elements may also be present. In contrast, when an element is referred to as being "directly connected with" another element, there are no intervening elements present.

A singular representation may include a plural representation unless it represents a definitely different meaning from the context.

Terms such as "include" or "has" are used herein and should be understood that they are intended to indicate an existence of several components, functions or steps, disclosed in the specification, and it is also understood that greater or fewer components, functions, or steps may likewise be utilized.

Mobile terminals presented herein may be implemented using a variety of different types of terminals. Examples of such terminals include cellular phones, smart phones, user equipment, laptop computers, digital broadcast terminals, personal digital assistants (PDAs), portable multimedia players (PMPs), navigators, portable computers (PCs), slate PCs, tablet PCs, ultra books, wearable devices (for example, smart watches, smart glasses, head mounted displays (HMDs)), and the like.

By way of non-limiting example only, further description will be made with reference to particular types of mobile terminals. However, such teachings apply equally to other types of terminals, such as those types noted above. In addition, these teachings may also be applied to stationary terminals such as digital TV, desktop computers, and the like.

Figure 1B:
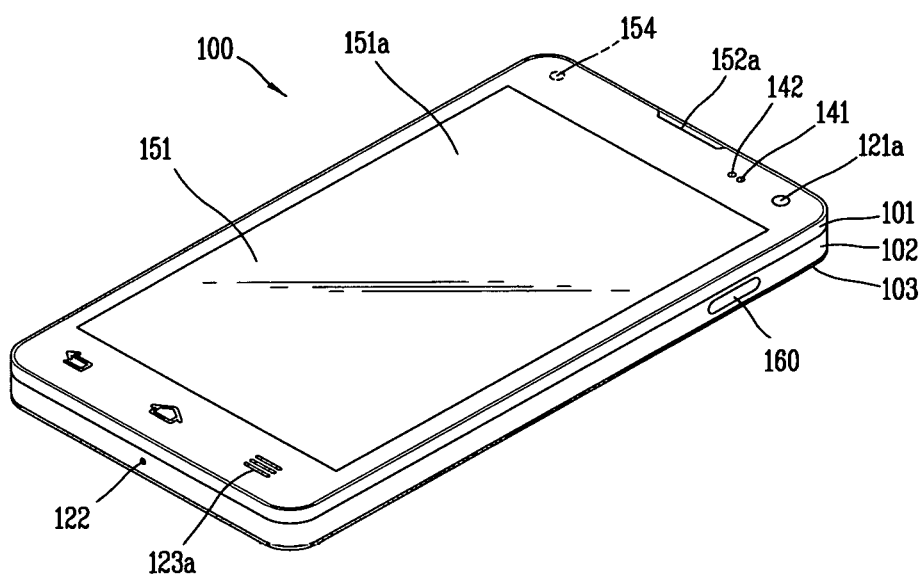
FIGS. 1B and 1C are conceptual diagrams illustrating an example of a mobile terminal according to the present disclosure viewed in different directions.
Figure 1C:
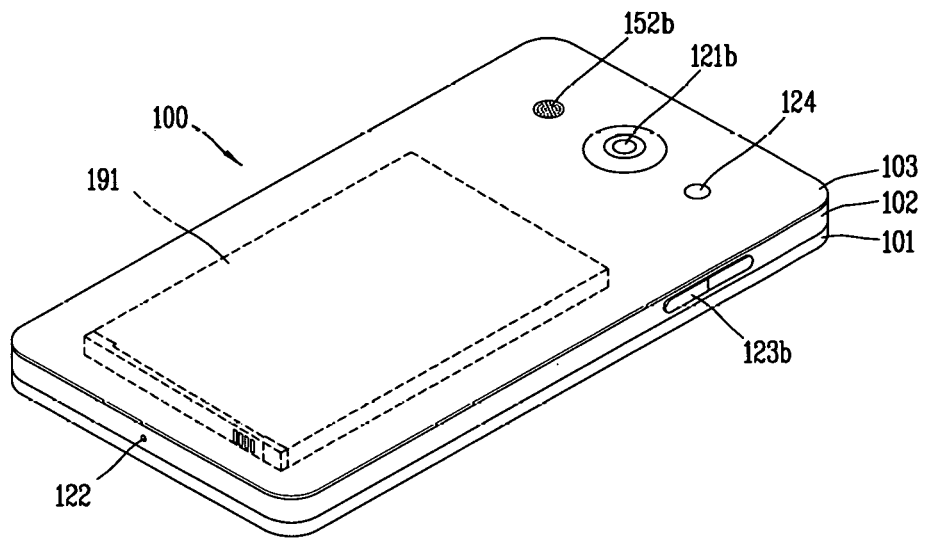

Referring to FIGS. 1A to 1C, FIG. 1A is a block diagram of a mobile terminal in accordance with one exemplary embodiment of the present invention, and FIGS. 1B and 1C are conceptual views illustrating one example of a mobile terminal, viewed from different directions.

The mobile terminal 100 may be shown having components such as a wireless communication unit 110, an input unit 120, a sensing unit 140, an output unit 150, an interface unit 160, a memory 170, a controller 180, and a power supply unit 190. It is understood that implementing all of the illustrated components is not a requirement, and that greater or fewer components may alternatively be implemented.

In more detail, the wireless communication unit 110 may typically include one or more modules which permit communications such as wireless communications between the mobile terminal 100 and a wireless communication system, communications between the mobile terminal 100 and another mobile terminal, or communications between the mobile terminal 100 and an external server. Further, the wireless communication unit 110 may typically include one or more modules which connect the mobile terminal 100 to one or more networks.

The wireless communication unit 110 may include one or more of a broadcast receiving module 111, a mobile communication module 112, a wireless Internet module 113, a short-range communication module 114, and a location information module 115.

The input unit 120 may include a camera 121 or an image input unit for obtaining images or video, a microphone 122, which is one type of audio input device for inputting an audio signal, and a user input unit 123 (for example, a touch key, a mechanical key, and the like) for allowing a user to input information. Data (for example, audio, video, image, and the like) may be obtained by the input unit 120 and may be analyzed and processed according to user commands.

The sensing unit 140 may typically be implemented using one or more sensors configured to sense internal information of the mobile terminal, the surrounding environment of the mobile terminal, user information, and the like. For example, the sensing unit 140 may include at least one of a proximity sensor 141, an illumination sensor 142, a touch sensor, an acceleration sensor, a magnetic sensor, a G-sensor, a gyroscope sensor, a motion sensor, an RGB sensor, an infrared (IR) sensor, a finger scan sensor, a ultrasonic sensor, an optical sensor (for example, camera 121), a microphone 122, a battery gauge, an environment sensor (for example, a barometer, a hygrometer, a thermometer, a radiation detection sensor, a thermal sensor, and a gas sensor, among others), and a chemical sensor (for example, an electronic nose, a health care sensor, a biometric sensor, and the like). The mobile terminal disclosed herein may be configured to utilize information obtained from one or more sensors of the sensing unit 140, and combinations thereof.

The output unit 150 may typically be configured to output various types of information, such as audio, video, tactile output, and the like. The output unit 150 may be shown having at least one of a display unit 151, an audio output module 152, a haptic module 153, and an optical output module 154. The display unit 151 may have an inter-layered structure or an integrated structure with a touch sensor in order to implement a touch screen. The touch screen may function as the user input unit 123 which provides an input interface between the mobile terminal 100 and the user and simultaneously provide an output interface between the mobile terminal 100 and a user.

The interface unit 160 serves as an interface with various types of external devices that are coupled to the mobile terminal 100. The interface unit 160, for example, may include any of wired or wireless ports, external power supply ports, wired or wireless data ports, memory card ports, ports for connecting a device having an identification module, audio input/output (I/O) ports, video I/O ports, earphone ports, and the like. In some cases, the mobile terminal 100 may perform assorted control functions associated with a connected external device, in response to the external device being connected to the interface unit 160.

The memory 170 is typically implemented to store data to support various functions or features of the mobile terminal 100. For instance, the memory 170 may be configured to store application programs executed in the mobile terminal 100, data or instructions for operations of the mobile terminal 100, and the like. Some of these application programs may be downloaded from an external server via wireless communication. Other application programs may be installed within the mobile terminal 100 at time of manufacturing or shipping, which is typically the case for basic functions of the mobile terminal 100 (for example, receiving a call, placing a call, receiving a message, sending a message, and the like). Application programs may be stored in the memory 170, installed in the mobile terminal 100, and executed by the controller 180 to perform an operation (or function) for the mobile terminal 100.

The controller 180 typically functions to control an overall operation of the mobile terminal 100, in addition to the operations associated with the application programs. The controller 180 may provide or process information or functions appropriate for a user by processing signals, data, information and the like, which are input or output by the aforementioned various components, or activating application programs stored in the memory 170.

Also, the controller 180 may control at least some of the components illustrated in FIG. 1A, to execute an application program that have been stored in the memory 170. In addition, the controller 180 may control at least two of those components included in the mobile terminal to activate the application program.

The power supply unit 190 may be configured to receive external power or provide internal power in order to supply appropriate power required for operating elements and components included in the mobile terminal 100. The power supply unit 190 may include a battery, and the battery may be configured to be embedded in the terminal body, or configured to be detachable from the terminal body.

At least part of the components may cooperatively operate to implement an operation, a control or a control method of a mobile terminal according to various embodiments disclosed herein. Also, the operation, the control or the control method of the mobile terminal may be implemented on the mobile terminal by an activation of at least one application program stored in the memory 170.

Referring to FIGS. 1B and 1C, the disclosed mobile terminal 100 includes a bar-like terminal body. However, the electronic device 100 may alternatively be implemented in any of a variety of different configurations. Examples of such configurations include watch type, clip-type, glasses-type, or a folder-type, flip-type, slide-type, swing-type, and swivel-type in which two and more bodies are combined with each other in a relatively movable manner, and combinations thereof. Discussion herein will often relate to a particular type of mobile terminal. However, such teachings with regard to a particular type of mobile terminal will generally apply to other types of mobile terminals as well.

Here, considering the mobile terminal 100 as at least one assembly, the terminal body may be understood as a conception referring to the assembly.

The mobile terminal 100 will generally include a case (for example, frame, housing, cover, and the like) forming the appearance of the terminal. In this embodiment, the case is formed using a front case 101 and a rear case 102. Various electronic components are interposed into a space formed between the front case 101 and the rear case 102. At least one middle case may be additionally positioned between the front case 101 and the rear case 102.

The display unit 151 is shown located on the front side of the terminal body to output information. As illustrated, a window 151a of the display unit 151 may be mounted to the front case 101 to form the front surface of the terminal body together with the front case 101.

The mobile terminal 100 may include a display unit 151, first and second audio output module 152a and 152b, a proximity sensor 141, an illumination sensor 142, an optical output module 154, first and second cameras 121a and 121b, first and second manipulation units 123a and 123b, a microphone 122, an interface unit 160, and the like.

Hereinafter, as illustrated in FIGS. 1B and 1C, description will be given of the exemplary mobile terminal 100 in which the front surface of the terminal body is shown having the display unit 151, the first audio output module 152a, the proximity sensor 141, the illumination sensor 142, the optical output module 154, the first camera 121a, and the first manipulation unit 123a, the side surface of the terminal body is shown having the second manipulation unit 123b, the microphone 122, and the interface unit 160, and the rear surface of the terminal body is shown having the second audio output module 152b and the second camera 121b.

However, those components may not be limited to the arrangement. Some components may be omitted or rearranged or located on different surfaces. For example, the first manipulation unit 123a may not be located on the front surface of the terminal body, and the second audio output module 152b may be located on the side surface of the terminal body other than the rear surface of the terminal body.

The display unit 151 is generally configured to output information processed in the mobile terminal 100. For example, the display unit 151 may display execution screen information of an application program executing at the mobile terminal 100 or user interface (UI) and graphic user interface (GUI) information in response to the execution screen information.

The display module 151 may include at least one of a liquid crystal display (LCD), a thin film transistor-LCD (TFT LCD), an organic light-emitting diode (OLED), a flexible display, a three-dimensional (3D) display and an e-ink display.

The display unit 151 may be implemented using two display devices, according to the configuration type thereof. For instance, a plurality of the display units 151 may be arranged on one side, either spaced apart from each other, or these devices may be integrated, or these devices may be arranged on different surfaces.

The display unit 151 may include a touch sensor that senses a touch with respect to the display unit 151 so as to receive a control command in a touch manner. Accordingly, when a touch is applied to the display unit 151, the touch sensor may sense the touch, and a controller 180 may generate a control command corresponding to the touch. Contents input in the touch manner may be characters, numbers, instructions in various modes, or a menu item that can be specified.

The first audio output module 152a may be implemented as a receiver for transmitting a call sound to a user's ear and the second audio output module 152b may be implemented as a loud speaker for outputting various alarm sounds or multimedia playback sounds.

The window 151a of the display unit 151 may include sound holes for emitting sounds generated from the first audio output module 152a. However, the present invention is not limited thereto, and the sounds may be released along an assembly gap between the structural bodies (for example, a gap between the window 151a and the front case 101). In this case, a hole independently formed to output audio sounds may not be seen or may otherwise be hidden in terms of appearance, thereby further simplifying the appearance of the mobile terminal 100.

The optical output module 154 may be configured to output light for indicating an event generation. Examples of such events may include a message reception, a call signal reception, a missed call, an alarm, a schedule alarm, an email reception, information reception through an application, and the like. When a user has checked a generated event, the controller 180 may control the optical output module 154 to stop the light output.

The first camera 121a may process image frames such as still or moving images obtained by the image sensor in a capture mode or a video call mode. The processed image frames can then be displayed on the display unit 151 or stored in the memory 170.

The first and second manipulation units 123a and 123b are examples of the user input unit 123, which may be manipulated by a user to provide input to the mobile terminal 100. The first and second manipulation units 123a and 123b may also be commonly referred to as a manipulating portion. The first and second manipulation units 123a and 123b may employ any method if it is a tactile manner allowing the user to perform manipulation with a tactile feeling such as touch, push, scroll or the like The first and second manipulation units 123a and 123b may also be manipulated through a proximity touch, a hovering touch, and the like, without a user's tactile feeling.

The drawings are illustrated on the basis that the first manipulation unit 123a is a touch key, but the present invention may not be necessarily limited to this. For example, the first manipulation unit 123a may be configured as a mechanical key, or a combination of a touch key and a push key.

The content received by the first and second manipulation units 123a and 123b may be set in various ways. For example, the first manipulation unit 123a may be used by the user to input a command such as menu, home key, cancel, search, or the like, and the second manipulation unit 123b may be used by the user to input a command, such as controlling a volume level being output from the first or second audio output module 152a or 152b, switching into a touch recognition mode of the display unit 151, or the like.

Hereinafter, embodiments related to an up-converter circuit and a mobile terminal having the up-converter circuit according to the present disclosure will be described with reference to the accompanying drawings. It will be apparent to those skilled in the art that the present disclosure may be embodied in other specific forms without departing from the spirit or essential characteristics thereof.

Figure 2:
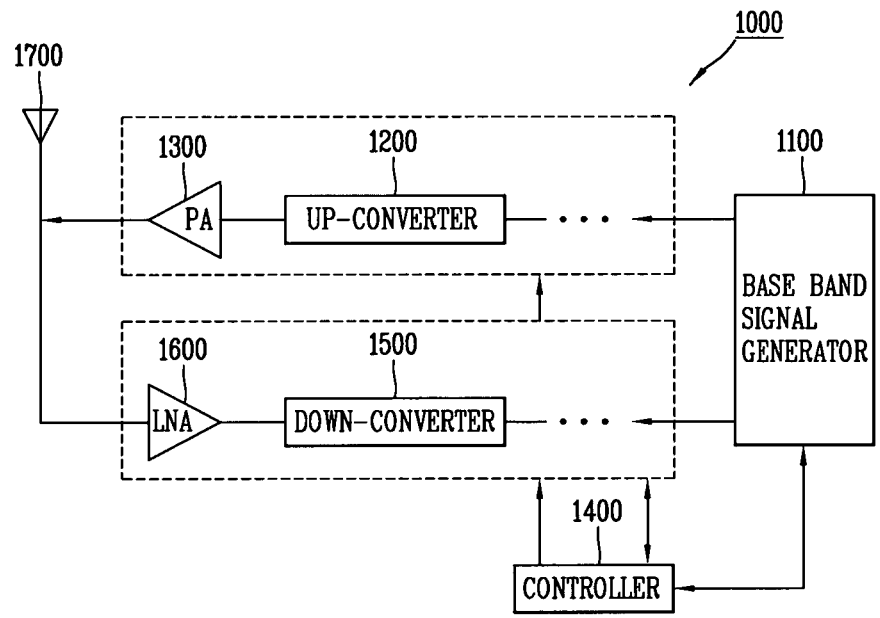
FIG. 2 illustrates a mobile terminal having an up-converter according to the present disclosure.

FIG. 2 illustrates a mobile terminal having an up-converter according to the present disclosure. Meanwhile, an element to be described in FIG. 2 may be included in the wireless communication unit 110 of FIG. 1A, and in particular, the wireless communication unit 110 may be included in the broadcast receiving module 111, the mobile communication module 112, and the like. However, the present disclosure is not limited thereto.

Referring to FIG. 2, a mobile terminal 1000 includes a baseband signal generating unit 1100, an up-converter 1200, a power amplifier (PA) 1300, and a controller 1400. In addition, the mobile terminal may further include a down-converter 1500, a low noise amplifier (LNA) 1600, and an antenna 1700. Here, the up-converter 1200 and the power amplifier 1300 correspond to transmitting units, and the down-converter 1500 and the LNA 1600 correspond to receiving units. In the present disclosure, the up-converter 1200 corresponding to a transmitting unit will be mainly described, but the down-converter 1500 corresponding to a receiving unit may also be configured to correspond thereto.

As described above, the up-converter 1200 and the PA 1300 according to the present disclosure may correspond to the wireless communication unit 110 of FIG. 1A. Accordingly, the wireless communication unit 110 may include the up-converter 1200 and the PA 1300 (or the down-converter 1500 and the LNA 1600), which are one or more modules that enable wireless communication. Thus, wireless communication may be performed between the mobile terminal 1000 and the wireless communication system, between the mobile terminal 1000 and another mobile terminal, or between the mobile terminal 1000 and an external server, via the up-converter 1200 and the power amplifier 1300.

Specifically, the baseband signal generating unit 1100 is configured to generate a baseband (BB) signal and provide it to a transmitter or a receiver. Meanwhile, the up-converter 1200 is configured to convert a baseband (BB) signal to a radio frequency (RF) signal. That is, the up-converter 1200 frequency up-converts the baseband signal to an RF signal of an RF band through a local oscillator. The PA 1300 is connected to the up-converter 1200, amplifies the RF signal from the up-converter 1200, and provides the amplified RF signal to the antenna 1500. The controller 1400 is configured to control a voltage applied to the up-converter 1200 to control an operation of the up-converter 1200.

Meanwhile, the LNA 1600 is configured to low-noise amplify the RF signal received from the antenna 1500. In addition, the down-converter 1500 is coupled to LNA 1600 and is configured to convert the low-noise amplified RF signal into a baseband signal. That is, the down-converter 1500 frequency-down converts the low-noise amplified RF signal to the baseband signal through the local oscillator. The controller 1400 is configured to control a voltage applied to the down-converter 1500 to control an operation of the down-converter 1500.

Regarding frequency up-conversion, a method of implementing up-conversion in an RF transmitter is using a voltage mode or current mode mixer (converter). The up-converted signal from the mixer is transmitted through the PA 1300 of a parallel type. However, the voltage mode implementation has several drawbacks, especially when a baseband source for driving exhibits high impedance. One problem is the tilt of the up-converted spectrum around a local oscillator frequency. In addition, when using a common mixer that feeds all parallel power amplifier unit cells, the size of the mixer switches needs to be scaled to cover the highest power level. One way to overcome this drawback is to integrate some of the subsequent power amplifier unit cells at the mixer stage. This method scales down power consumption of the mixer to required output power. Meanwhile, this tilt effect may be eliminated using current mode sampling. However, as part of the power amplifier cell, the current mode mixer refers to a constant tail current. Meanwhile, in order to maximize efficiency of the power amplifier, an operating point needs to move toward. Class B, which means that the bias current is very close to zero.

Meanwhile, a method of improving phase linearity of the up-converter according to the present disclosure, i.e., removing the remaining charges of the transistor, will be described in detail. In this regard, FIG. 3 illustrates a structure of a current mode up-converter according to the present disclosure.

Meanwhile, as described above, efficiency of the power amplifier 1300 may be significantly improved by biasing the power amplifier to class B. Meanwhile, due to the bias current, it may be a difficulty to integrate the power mode mixer as part of the power amplifier. In the circuit structure of FIG. 3, an amount of floating charge during an OFF-cycle of the local oscillator (LO) pulse is highly dependent on a baseband signal voltage, and this means considerable phase nonlinearty.

Figure 3:
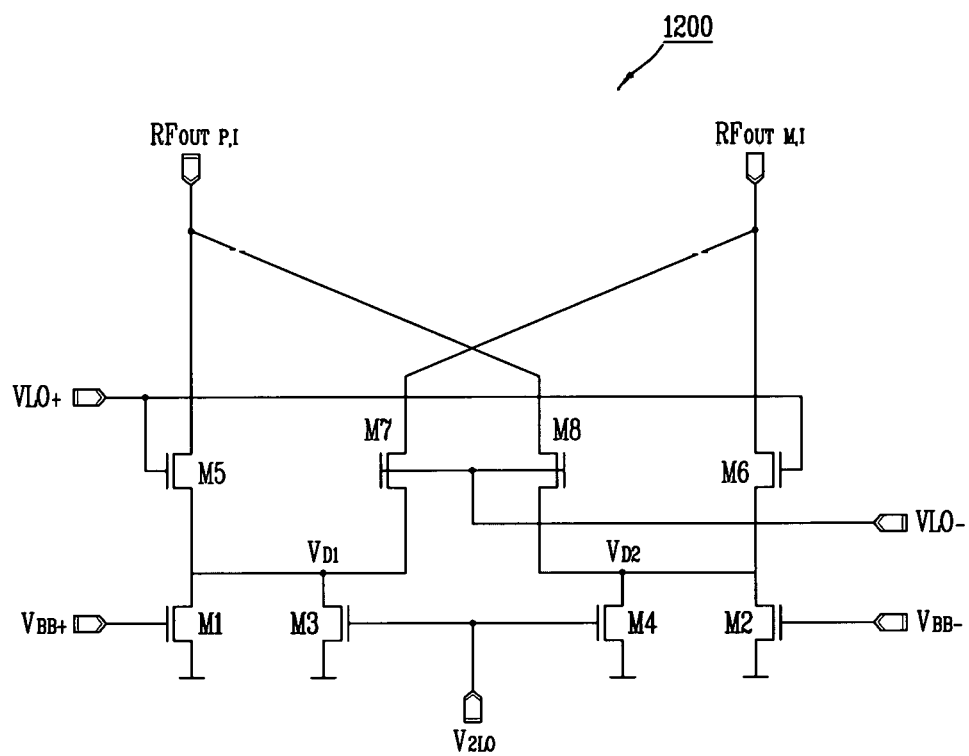
FIG. 3 illustrates a structure of a current mode up-converter according to the present disclosure.

Meanwhile, referring to FIG. 3, the up-converter 1200 includes first through fourth transistors M1 through M4. Here, the first transistor M1 and the second transistor M2 are configured such that a base band voltage VBB+ is applied to a gate. Specifically, the controller 1400 may control the VBB+ and VBB− voltages to be applied to the gate of the first transistor M1 and the gate of the second transistor M2.

Meanwhile, a drain of the third transistor M3 is connected in parallel to a drain of the first transistor M1. Here, drain voltages of the first transistor M1 and the third transistor M3 are represented by VD1. In addition, the fourth transistor M4 is configured such that a drain thereof is connected in parallel with a drain of the second transistor M2. Here, the drain voltages of the second and fourth transistors M2 and M4 are represented by VD2. In detail, the controller 1400 may control the V2LO voltage to be applied to the gates of the third transistor M3 and the fourth transistor M4.

The drain of the first transistor M1 and the drain of the second transistor M2 may respectively output a first RF signal and a second RF signal through the transistors connected in series. That is, the first transistor M1 and the second transistor M2 may be connected in series with a fifth transistor M5 and a sixth transistor M6, respectively, in order to output an RF signal. Also, the fifth transistor M5 and the sixth transistor M6 may be connected in parallel to the fourth transistor M4 and the third transistor M3, respectively.

Specifically, the fifth transistor M5 is configured to have a source connected in series with the drain of the first transistor M1 and to output a first RF signal through the drain. The sixth transistor M6 is configured to have a source connected in series with the drain of the second transistor M2 and to output a second RF signal through the drain. Here, the first RF signal may be an in-phase (I) channel signal and the second RF signal may be a quadrature-phase (Q) channel signal, but the present disclosure is not limited thereto. Referring to FIGS. 1 and 3, the first RF signal and the second RF signal are applied to a first power amplifier 1310 and a second power amplifier 1320, respectively. Also, a signal amplified and combined through the first power amplifier 1310 and the second power amplifier 1320 may be transmitted through the antenna 1700. Here, a controller 1400 may control a VLO+ voltage to be applied to the gates of the fifth transistor M5 and the sixth transistor M6.

Thus, phase linearity characteristics such as phase non-linearity, or the like, may be improved by an operation of removing charges of the V2LO voltage during an OFF period of the LO pulse signal and the transistor with the drain connected to each other in parallel.

Meanwhile, the fifth transistor M5 and the sixth transistor M6 may be connected in parallel with a seventh transistor M7 and an eighth transistor M8, respectively, for an ON/OFF operation of the LO pulse signal. Specifically, a source of the seventh transistor M7 may be connected in parallel with the drain of the third transistor M3, and a drain thereof may be connected in parallel with the drain of the sixth transistor M6. Also, the source of the eighth transistor M8 may be connected in parallel with the drain of the fourth transistor M4, and a drain of the eighth transistor M8 may be connected in parallel with the drain of the fifth transistor M5. Specifically, the controller 1400 may control a VLO− voltage to be applied to the gates of the seventh transistor M7 and the eighth transistor M8.

Figure 4:
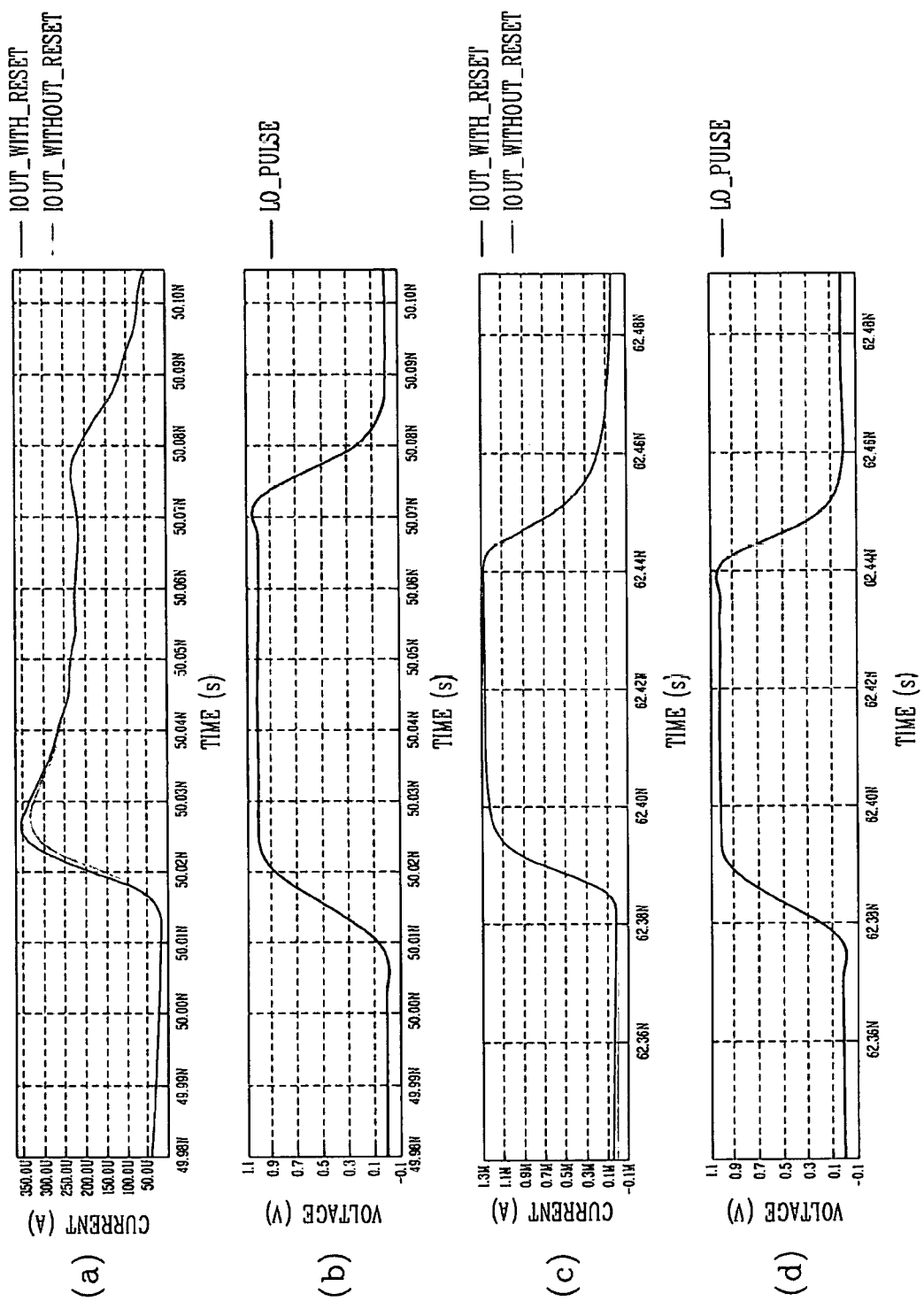
FIG. 4 illustrates a simulation result of an output current according to the presence or absence of charge removal when a baseband signal according to the present disclosure is close to a bias point.

Meanwhile, as described above, the amount of floating charges during the OFF-cycle of the local oscillator (LO) pulse in the circuit structure of FIG. 3 greatly depends on the baseband signal voltage VBB, which means significant phase nonlinearity. In this regard, FIG. 4 illustrates a simulation result of the output current according to whether or not charges are removed when the baseband signal according to the present disclosure is close to the bias point. Here, the drawing below illustrates an output current when the baseband signal is close to a maximum voltage. As shown in FIG. 4, it may be seen that the amount of the floating charges greatly depends on the baseband signal voltage VBB. Therefore, it can be seen that the amount of floating charges (or the amount of remaining charges) are dependent on an initial voltage of the node before the LO pulse.

Figure 5:
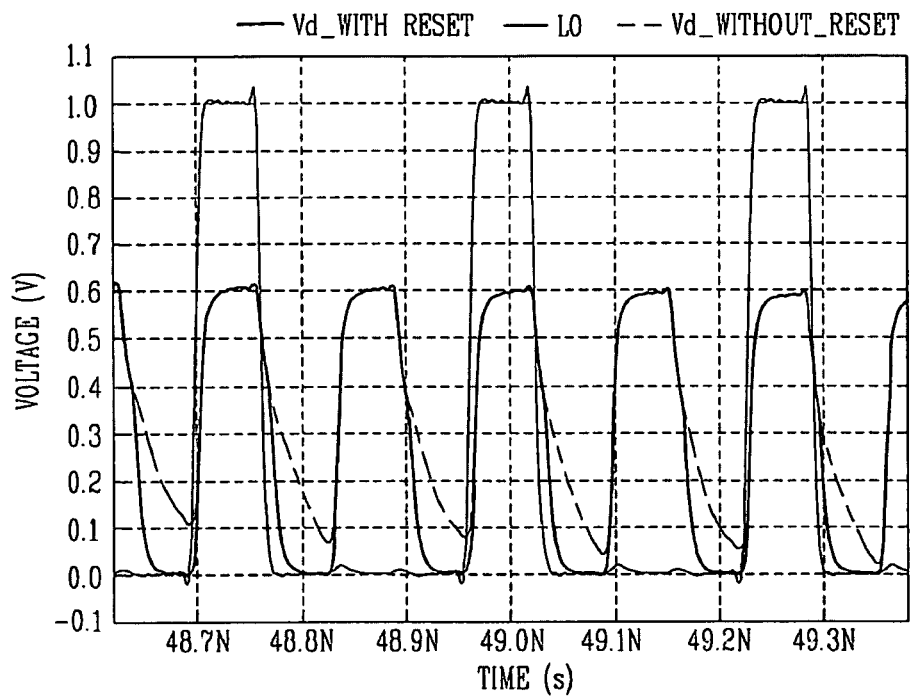
FIG. 5 is a diagram illustrating that an initial charge on a VD node changes as a function of a baseband voltage when there is no additional charge removal in relation to the present disclosure.

Meanwhile, FIG. 5 is a diagram illustrating that the initial charge on the VD node is changed as a function of a baseband voltage in the absence of additional charge removal in relation to the present disclosure. Referring to FIG. 5, in the absence of additional charge removal, there are still remaining charges over time, and phase linearity characteristics of the up-converter may be degraded by this remaining charges (or floating charges). Referring to FIGS. 3 and 5, it can be seen that the node voltages VD1 and VD2 of the input transistors M1 and M2 have similar waveforms regardless of charge removal, when the baseband voltage is high. Meanwhile, it can be seen that, when the baseband voltage is low, the effect of removing the node voltages VD1 and VD2 is remarkable. Therefore, the charge removal is particularly effective when the baseband voltage is low.

That is, if the charges can be removed during the OFF cycle of the LO signal using the additional transistors M3 and M4 in the amplifier structure of FIG. 3, the amount of charges on the VD node is zero, regardless of the baseband voltage. That is, the above-mentioned VLO+ voltage may be applied in the form of a LO pulse signal. Here, a V2LO voltage must be pulled low to below a threshold voltage before the LO pulse signal is generated and applied to the gates of the fifth transistor M5 and the sixth transistor M6. Thus, charge removal may be performed during the OFF cycle of the LO pulse signal. Therefore, a significant improvement in the phase linearity may be achieved by this operation.

Figure 6:
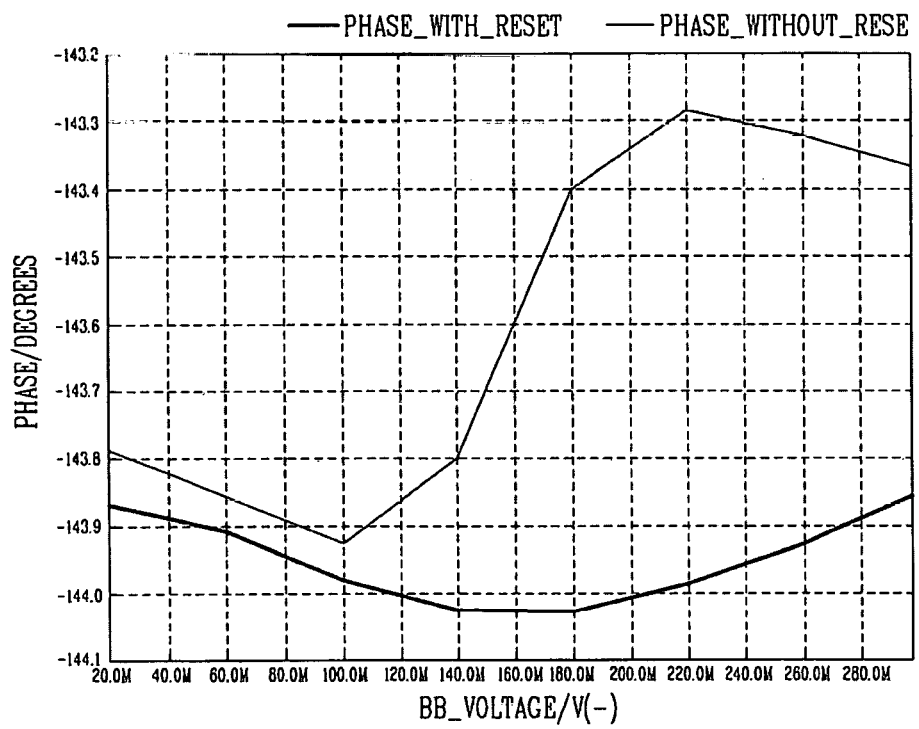
FIG. 6 is a diagram illustrating phase values of an up-converted signal as a function of a baseband voltage according to whether charges are removed according to the present disclosure.

FIG. 6 is a diagram illustrating phase values of an up-converted signal as a function of a baseband voltage according to whether or not charges are removed according to the present disclosure. Referring to FIG. 6, it may be seen that, in the absence of charge removal, a phase of an up-converted signal is shifted as a baseband voltage changes. Meanwhile, it can be seen that the phase of the up-converted signal has a value within a predetermined range even when the baseband voltage is changed as the charge removal is performed.

Figure 7:
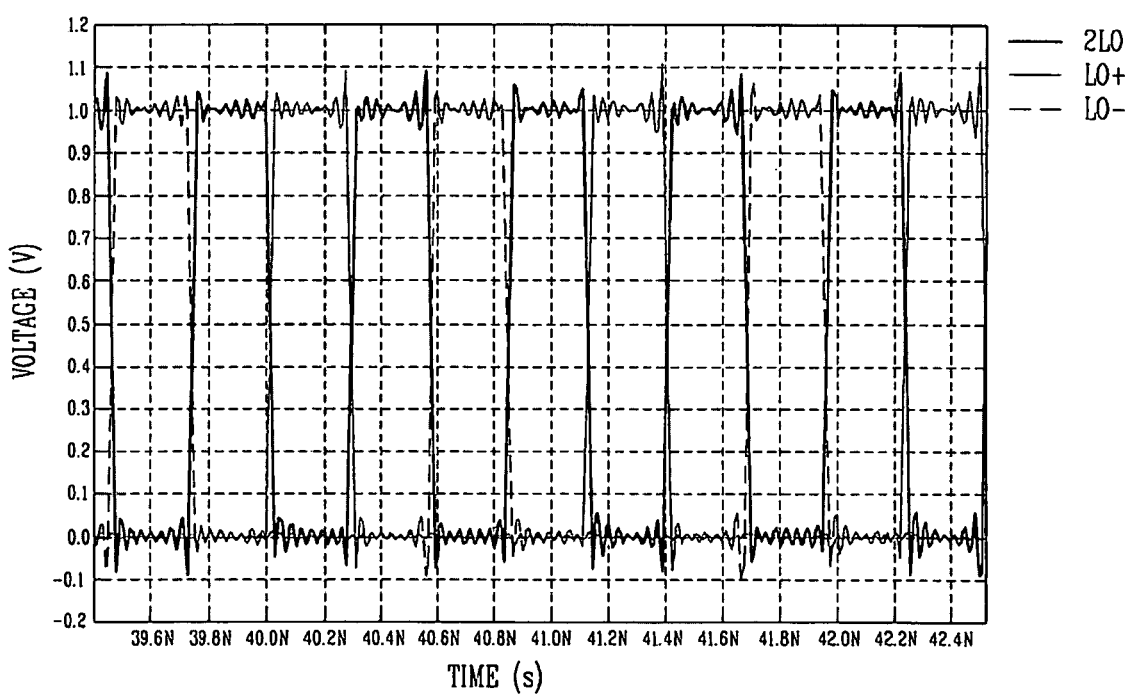
FIG. 7 illustrates the time-dependent variations of LO inputs (VLO+, VLO−) and V2LO voltage values according to the present disclosure.

Meanwhile, FIG. 7 illustrates a time-dependent variation of LO inputs (VLO+, VLO−) and the V2LO voltage value according to the present disclosure. Referring to FIG. 7, as a first LO input (VLO−) transitions from a high state to a low state, the V2LO voltage value transitions from a low state to a high state. Also, a second LO input (VLO+) transitions from a low state to a high state as the V2LO voltage transition transitions from a high state to a low state. Thus, it is possible for the V2LO signal to remain low (or grounded) slightly or immediately before the LO pulses (VLO+ and VLO−) are generated.

The idea proposed in the up-converter according to the present disclosure with improved phase linearity characteristics as described above is to connect additional transistors in parallel with a baseband input transistor. Thus, charges may be removed from a drain of the input transistor by the parallel transistor.

Meanwhile, the transistor parallel connection structure according to the present disclosure is different from other documents in that it is not a simple parallel connection structure but connects drain terminals to each other. Also, the transistor parallel connection structure according to the present disclosure is different from other documents in that the transistors of the local oscillator are not formed in a push-pull type parallel structure but the input transistors are formed in a parallel connection structure. Meanwhile, in that the charge removal effect is significant when the baseband voltage is low, a switch (not shown) may be provided to connect the third transistor M3 and the fourth transistor M4 to the first transistor M1 and the second transistor M2 in parallel only when a baseband voltage is detected and the detected voltage is lower than a specific value. Therefore, when the baseband voltage is equal to or higher than the specific value, the switch may be turned off so that the conversion gain characteristic of the up-converter may be maximized. Meanwhile, when the baseband voltage is below the specific value, the switch may be turned on so that the phase linearity characteristics of the up-converter may be improved.

In addition, the charge removal operation according to the present disclosure must be performed during the OFF cycle of the LO signal. In the mixer structure as illustrated in FIG. 3, a signal for driving a charge removal transistor must be at V2LO at a corresponding frequency.

Figure 8:
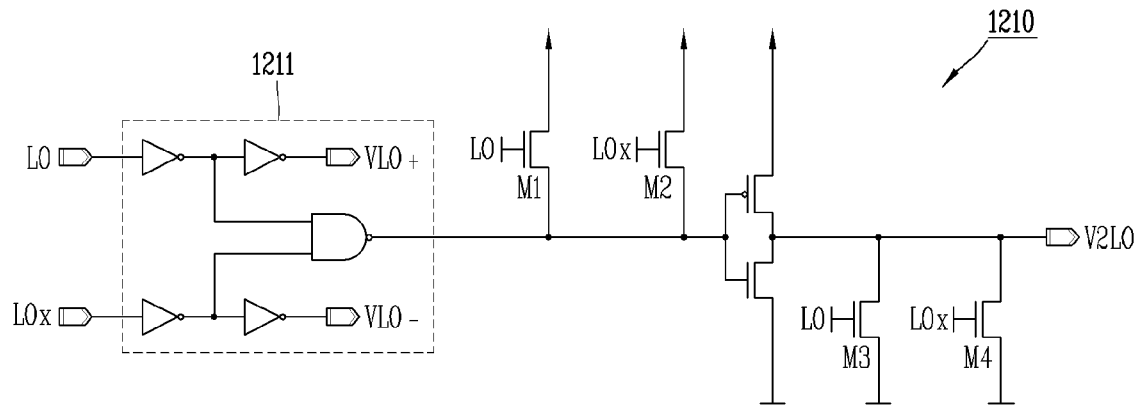
FIG. 8 illustrates a configuration of a buffer circuit for providing a voltage to an up-converter according to the present disclosure.

In this regard, FIG. 8 illustrates a configuration of a buffer circuit for providing a voltage to the up-converter according to the present disclosure. Here, since the buffer circuit provides a bias voltage to a specific element of the up-converter, the buffer circuit may be referred to as a bias circuit. Referring to FIGS. 3 and 8, a buffer circuit 1210 may be configured to provide the V2LO voltage to the gates of the third transistor M3 and the fourth transistor M4. Specifically, the buffer circuit 1210 includes a logic circuit 1211 for performing a NOR operation on LO and Lox which are logic inputs and first to fourth transition transistors M1 to M4. In this regard, an output of the buffer circuit 1211 corresponding to the V2LO voltage is provided to the up-converter 1200. In addition, the first to fourth transition transistors M1 to M4 enable a rapid transition from a high state to a low state of the V2LO voltage.

That is, the signals VLO+, VLO− and V2LO, which drive the mixer structure transistor as shown in FIG. 3, may be derived from the LO signal from the buffer circuit 1210 in FIG. 8. Using the transition transistors M1 to M4 interconnected in parallel in the buffer circuit 1210, the V2LO signal may be maintained in a low state (or grounded state) slightly or immediately before the LO pulses (VLO+ and VLO−) are generated. Thus, when the buffer circuit 1210 of FIG. 8 is integrated into a portion of the mixer or mixer cell of FIG. 3, current consumption may be scaled to the number of active cells.

Figure 9:
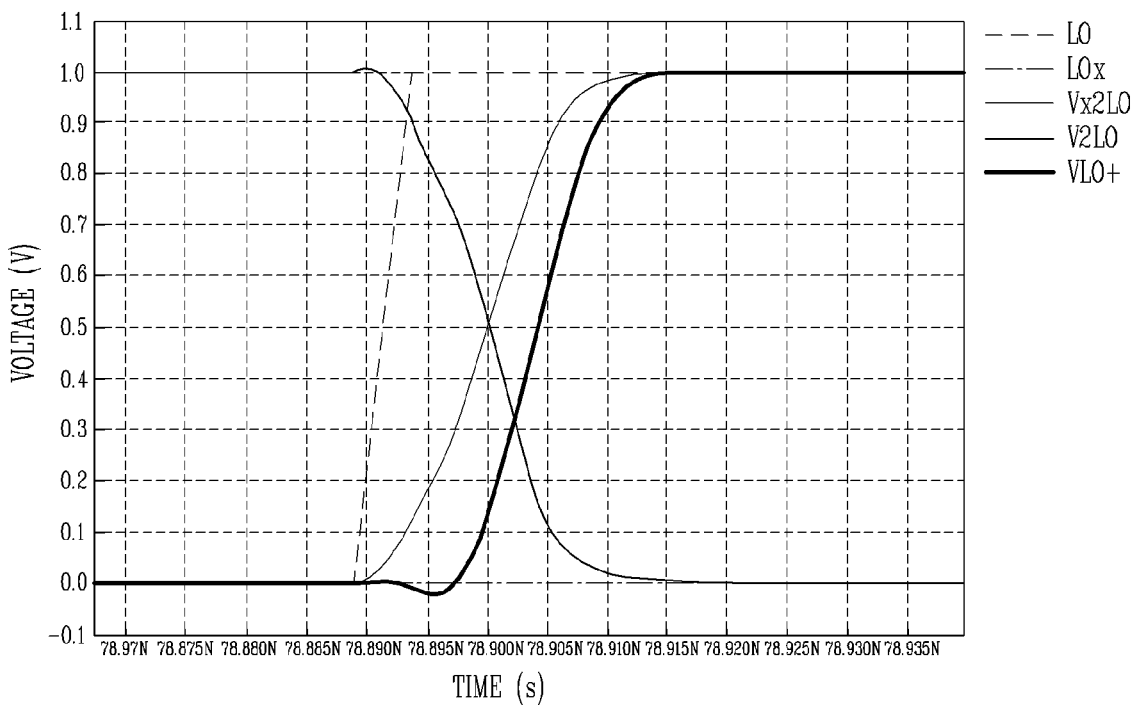
FIG. 9 illustrates a transition state of a V2LO signal according to the present disclosure.

In this regard, FIG. 9 illustrates a transition state of the V2LO signal according to the present disclosure. Referring to FIG. 9, it can be seen that the V2LO signal transitions from a high state (e.g., 1V) to a low state (e.g., 0V) slightly or immediately before the LO pulse (VLO+) is generated. A significant advantage of the layout in the mixer structure of FIG. 3 is that the V2LO signal is derived from the LO signal and is physically close to the mixer cell.

The up-converter for improving the phase linearity characteristics according to the present disclosure and the mobile terminal including the up-converter have been described above. The above-described circuit structure and voltage control operation are applicable not only to the up-converter but also to a down-converter.

Meanwhile, the method for improving distortion characteristics of the up-converter according to the present disclosure may also be utilized in a fifth generation (5G) (next generation) communication system as well as a fourth generation (4G) communication system. Meanwhile, in the 4th generation (4G) communication system, two or more antennas 1700 may support multi-input multi-output (MIMO). Meanwhile, in the fifth generation (5G) (next generation) communication system, two or more array antennas 1700 may support beamforming with multi-input multiple-output (MIMO). Accordingly, a plurality of up-converters may be separately provided. Here, the meaning that a plurality of up-converters are separately provided includes a case where one local oscillator is commonly used and a mixer is separately provided.

Figure 10:
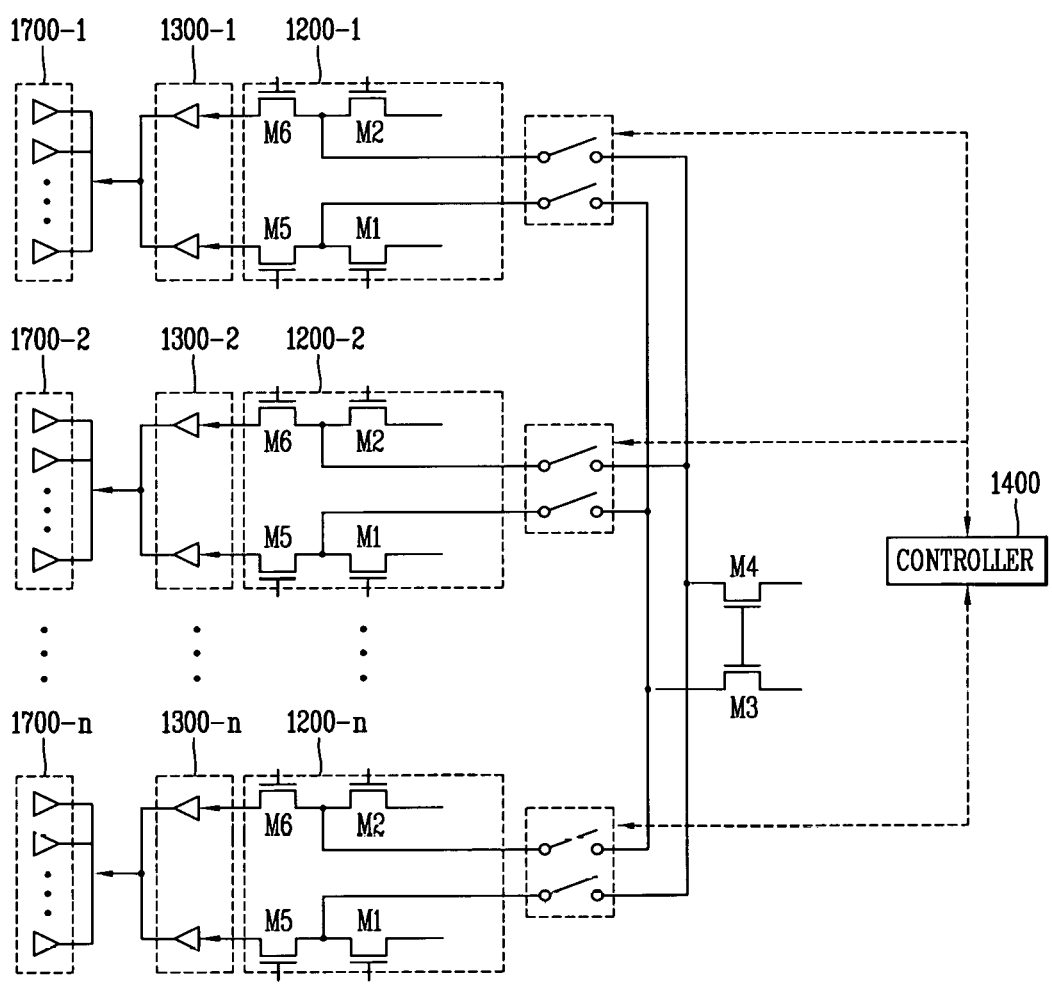
FIG. 10 illustrates a configuration of a mobile terminal having a plurality of up-converters according to the present disclosure.

Meanwhile, FIG. 10 illustrates a configuration of a mobile terminal having a plurality of up-converters according to the present disclosure. Referring to FIG. 10, a plurality of array antennas may include a first array antenna 1700-1, a second array antenna 1700-2, and an nth array antenna 1700-n. Here, n×n MIMO may be supported by using the first to nth array antennas 1700-1 to 1700-n. Each of the first to nth array antennas 1700-1 through 1700-n may include a plurality of antenna elements, thereby adjusting a phase applied to the plurality of antenna elements to perform beamforming.

Meanwhile, the up-converter 1200 and the power amplifier 1300 of FIG. 2 may include the first to nth up-converters 1200-1 to 1200-n and the first to nth power amplifier 1300-1 to 1300-n of FIG. 10. Here, the first to nth up-converters 1200-1 to 1200-n may be connected to the first to nth power amplifiers 1300-1 to 1300-n, respectively. Here, the controller may control the first to nth up-converters 1200-1 to 1200-n so that charges may be removed during the OFF cycle of the LO pulse signal in the first to nth up-converters 1200-1 to 1200-n. To this end, the third transistor M3 and the fourth transistor M4 may be provided in the first to nth up-converters 1200-1 to 1200-n, respectively.

Figure 11:
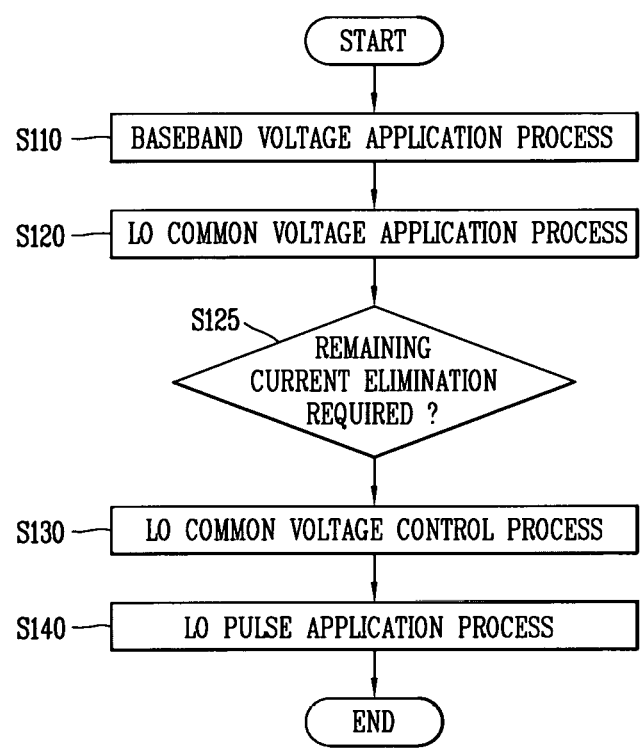
FIG. 11 illustrates a configuration of a mobile terminal having a plurality of up-converters according to another embodiment of the present disclosure.

Meanwhile, the third transistor M3 and the fourth transistor M4 may be provided outside the first up-converter to the n-th up-converter 1200-1 to 1200-n. In this regard, FIG. 11 illustrates a configuration of a mobile terminal having a plurality of up-converters according to another embodiment of the present disclosure. Comparing to FIG. 10, FIG. 11 is different from FIG. 10 in that the third transistor M3 and the fourth transistor M4 are provided outside the first up-converter to the n-th up-converter 1200-1 to 1200-n. Thus, descriptions which was already described in FIG. 10 are omitted.

In this case, the controller 1400 may optimize the phase linearity characteristics and the conversion gain characteristic by controlling ON/OFF states of the charge removal transistor connected in parallel with the input transistor. In this regard, the controller 1400 may control ON/OFF of an electrical connection between the third transistor M3 and the fourth transistor M4 and the first transistor M1 and the second transistor M2 of each of the first to nth up-converters 1200-1 to 1200-*n*.

Meanwhile, even when a plurality of mixers are provided as described above, a local oscillator may be provided in common. In order to optimize a layout design, the charge removal transistor may be disposed separately outside the first to nth up-converters 1200-1 to 1200-*n*. Here, the controller 1400 may select an up-converter required to quickly transition from a high state of the V2LO voltage to a low state during the OFF cycle of the LO pulse signal, among the first to nth up-converters 1200-1 to 1200-*n*. Also, the controller 1400 may control an electrical connection of the third transistor M3 and the fourth transistor M4 and the first transistor M1 and the second transistor M2 of the selected up-converter, to an ON state. Meanwhile, the controller 1400 may control an electrical connection of the third transistor M3 and the fourth transistor M3 and the first transistor M1 and the second transistor M2 of the remaining unselected up-converter, to an OFF state.

In this regard, when the baseband voltage is equal to or higher than the specific value, the controller 1400 may control the electrical connection to an OFF state to optimize a conversion gain. Meanwhile, when the baseband voltage is lower than the specific value, the controller 1400 may control the electrical connection to an ON state to improve the phase linearity characteristics.

As described above, by the charge removal transistors disposed separately outside the first to nth up-converters 1200-1 to 1200-*n*, the phase linearity characteristics may be improved without increasing the number of transistors, even when the number of the up-converters is increased.

In the foregoing, the up-converter and the mobile terminal having the up-converter according to an aspect of the present disclosure have been described. Hereinafter, a method of controlling the up-converter according to another aspect of the present disclosure will be described. The up-converter and the mobile terminal having the up-converter described above may be used in combination with the following control method.

In this regard, FIG. 12 illustrates a flowchart of a control method for improving phase linearity characteristics of the up-converter according to the present disclosure. Referring to FIG. 12, the control method for improving the phase linearity characteristics may be performed by the controller 1400. Here, the controller 1400 corresponds to a processor or a modem, and the corresponding operations may be performed by a communication processor (CP) or an application processor (AP). Meanwhile, the control method for improving the phase linearity characteristics includes a baseband voltage application step (S110), an LO common voltage application step (S120), an LO common voltage control step (S130), and a LO pulse application step (S140). Also, the method may further include a remaining charge removal determination step (S125) before the LO common voltage control step (S130).

In the baseband voltage application step (S110), the baseband voltage is applied to the gates of the first transistor and the second transistor. Meanwhile, in the LO common voltage control step (S120), the V2LO voltage is applied to the gates of the third transistor and the fourth transistor. In this case, the third transistor and the fourth transistor have a structure in which drains thereof are connected to the drains of the first transistor and the second transistor in parallel as illustrated in FIG. 3.

In the LO pulse application step (S140), the VLO+ voltage is applied to the gates of the fifth transistor and the sixth transistor. Here, the fifth transistor is configured such that a source thereof is connected in series to the drain of the first transistor and a first RF signal is output through the drain as illustrated in FIG. 3. Also, the sixth transistor is configured such that a source thereof is connected in series to the drain of the second transistor and a second RF signal is output through the drain as shown in FIG. 3.

Meanwhile, in the LO pulse application step S140, the V2LO signal may be maintained in a low state (or a ground state) through the LO common voltage control step (S130) slightly or immediately before the LO pulse (VLO+ or VLO−) is generated, and thus, the remaining charges may be removed to improve the phase linearity characteristics.

Meanwhile, it is determined whether there is a need to remove remaining charges of the input transistor in the remaining charge removal determination step (S125). Here, if the baseband voltage is lower than the specific value, the LO common voltage control step (S130) may be performed. Meanwhile, if the baseband voltage is equal to or higher than the specific value, the LO common voltage control step (S130) may not be performed and the LO pulse application step (S140) may be performed, but the present disclosure is not limited thereto. That is, if it is determined that the remaining charge removal is necessary in the remaining charge removal determination step (S125), the V2LO signal may be controlled to be maintained in a low state (or grounded state) through the LO common voltage control step S130 slightly or immediately before the LO pulse (VLO+ or VLO−) is generated. Meanwhile, if it is determined that the remaining charge removal is not necessary in the remaining charge removal determination step (S125), the LO pulse application step S140 may be performed without a separate remaining charge removal step.

The technical effects of the up-converter, the mobile terminal having the up-converter, and the control method thereof according to the present disclosure are as follows.

According to at least one of the embodiments of the present disclosure, the up-converter and the mobile terminal with improved phase linearity characteristics may be provided.

In addition, according to at least one of the embodiments of the present disclosure, the RF front end and the mobile terminal with improved frequency drift performance by removing remaining charges before a pulse signal of a local oscillator (LO) is applied may be provided.

Furthermore, according to at least one of the embodiments of the present disclosure, the mobile terminal including the RF front end with improved phase linearity characteristics may be provided even in a structure including a plurality of up-converters.

Further scope of applicability of the present invention will become apparent from the following detailed description. It should be understood, however, that the detailed description and specific examples, such as the preferred embodiment of the invention, are given by way of illustration only, since various changes and modifications within the spirit and scope of the invention will be apparent to those skilled in the art.

In relation to the present invention, operations of removing remaining charges and controlling phase linearity in a mobile terminal having an up-converter can be implemented as computer-readable codes in a program-recorded medium. The computer-readable medium may include all types of recording devices each storing data readable by a computer system. Examples of such computer-readable media may include hard disk drive (HDD), solid state disk (SSD), silicon disk drive (SDD), ROM, RAM, CD-ROM, magnetic tape, floppy disk, optical data storage element and the like. Also, the computer-readable medium may also be implemented as a format of carrier wave (e.g., transmission via an Internet). The computer may include the controller 180 of the terminal. Therefore, it should also be understood that the above-described embodiments are not limited by any of the details of the foregoing description, unless otherwise specified, but rather should be construed broadly within its scope as defined in the appended claims, Therefore, all changes and modifications that fall within the metes and bounds of the claims, or equivalents of such metes and bounds are therefore intended to be embraced by the appended claims.

The invention claimed is:

1. A mobile terminal comprising:
an up-converter converting a baseband (BB) signal into a radio frequency (RF) signal; and
a controller controlling a voltage applied to the up-converter; and
a first power amplifier and an nth power amplifier,
wherein the up-converter includes:
a first transistor and a second transistor each having a gate to which a baseband voltage is applied; a third transistor having a drain connected in parallel to a drain of the first transistor;
and a fourth transistor having a drain connected in parallel to a drain of the second transistor,
wherein the up-converter includes a first up-converter to an nth up-converter connected to the first power amplifier to the nth power amplifier, respectively and
the controller controls to remove charges during an OFF cycle of an LO pulse signal in the first up-converter and the nth up-converter.

2. The mobile terminal of claim 1, further comprising:
a fifth transistor having a source connected in series to the drain of the first transistor and outputting a first RF signal through a drain; and
a sixth transistor having a source connected in series to the drain of the second transistor and outputting a second RF signal through a drain.

3. The mobile terminal of claim 2, further comprising:
a seventh transistor having a source connected to the drain of the third transistor and a drain connected to the drain of the sixth transistor; and
an eighth transistor having a source connected to the drain of the fourth transistor and a drain connected to the drain of the fifth transistor.

4. The mobile terminal of claim 3, wherein the controller controls the up-converter to apply
VBB+ and VBB− voltages to the gate of the first transistor and the gate of the second transistor, respectively,
a V2LO voltage to the gates of the third transistor and the fourth transistor,
a VLO+ voltage to the gates of the fifth transistor and the sixth transistor, and
a VLO− voltage to the gates of the seventh transistor and the eighth transistor.

5. The mobile terminal of claim 4, wherein
the VLO+ voltage is applied in the form of an LO pulse signal, and
before the LO pulse signal is generated and applied to the gates of the fifth transistor and the sixth transistor, the V2LO voltage is pulled low to below a threshold value to perform charge removal during an OFF cycle of the LO pulse signal.

6. The mobile terminal of claim 4, further comprising:
a buffer circuit providing the V2LO voltage to the gates of the third and fourth transistors,
wherein the buffer circuit includes:
a logical circuit performing NOR operation on logical inputs LO and Lox; and
first to fourth transition transistors connected in parallel to outputs of the logical circuit,
an output of the buffer circuit corresponding to the V2LO voltage is provided to the up-converter, and
the first to fourth transition transistors enable fast transition of the V2LO voltage from a high state to a low state.

7. The mobile terminal of claim 2, wherein
the first RF signal is an in-phase (I) channel signal, the second RF signal is a quadrature-phase (Q) channel signal, and
the first RF signal and the second RF signal are applied to a first power amplifier and a second power amplifier, respectively, and a signal amplified and combined through the first power amplifier and the second power amplifier is transmitted through an antenna.

8. The mobile terminal of claim 1, wherein
the controller controls ON/OFF of an electrical connection between the third transistor and the fourth transistor and a first transistor and a second transistor of each of first to nth up-converters.

9. The mobile terminal of claim 4, wherein
the third transistor and the fourth transistor are disposed outside of the first up-converter to the nth up-converter, and
the controller selects an up-converter required to quickly transition from a high state of the V2LO voltage to a low state during an OFF cycle of the LO pulse signal, among the first up-converter to the nth up-converter, and
control an electrical connection of the third transistor and the fourth transistor and the first transistor and the second transistor of the selected up-converter, to an ON state.

10. An up-converter for converting a baseband signal into a radio frequency (RF) signal, the up-converter comprising:
a first transistor and a second transistor each having a gate to which a baseband voltage is applied;
a third transistor having a drain connected in parallel to a drain of the first transistor;
a fourth transistor having a drain connected in parallel to a drain of the second transistor;
a fifth transistor having a source connected in series to the drain of the first transistor and outputting a first RF signal through a drain; and
a sixth transistor having a source connected in series to the drain of the second transistor and outputting a second RF signal through a drain, wherein a V2LO voltage is applied to gates of the third transistor and the fourth transistor, and a VLO+ voltage is applied to gates of the fifth transistor and the sixth transistor,
wherein the drain of the first transistor and the drain of the second transistor output a first RF signal and a second RF signal through a transistor connected in series, respectively,
wherein the VLO+ voltage is applied in the form of an LO pulse signal, and before the LO pulse signal is generated and applied to the gates of the fifth transistor and the sixth transistor, the V2LO voltage is pulled low to below a threshold value to perform charge removal during an OFF cycle of the LO pulse signal.

11. The up-converter of claim 10, further comprising:
a seventh transistor having a source connected in parallel to the drain of the third transistor and a drain connected in parallel to the drain of the sixth transistor; and
an eighth transistor having a source connected in parallel to the drain of the fourth transistor and a drain connected in parallel to the drain of the fifth transistor.

12. The up-converter of claim 11, wherein
VBB+ and VBB− voltages are applied to the gate of the first transistor and the gate of the second transistor, respectively,
a VLO− voltage is applied to the gates of the seventh transistor and the eighth transistor.

* * * * *